United States Patent [19]

Ichikawa

[11] Patent Number: 4,991,125
[45] Date of Patent: Feb. 5, 1991

[54] DISPLACEMENT DETECTOR
[75] Inventor: Souji Ichikawa, Sagamihara, Japan
[73] Assignee: Mitutoyo Corporation, Japan
[21] Appl. No.: 340,451
[22] Filed: Apr. 19, 1989
[51] Int. Cl.$^5$ .......................... G01D 5/34; H03M 1/22
[52] U.S. Cl. ................................ 364/560; 250/231.14;
250/237 G; 33/707; 356/144; 341/13
[58] Field of Search ............... 364/560, 559, 561, 550,
364/551.01; 33/706-708, 1 D, 1 N, 1 PT;
356/140, 144, 375; 341/13, 14; 250/237 G, 231
SE, 560, 231.14

[56] References Cited

U.S. PATENT DOCUMENTS

| | | | |
|---|---|---|---|
| 4,507,647 | 3/1985 | Minami et al. | 341/13 |
| 4,529,964 | 7/1985 | Minami et al. | 33/707 X |
| 4,602,436 | 7/1986 | Ernst | 250/237 G X |
| 4,686,362 | 8/1987 | Merlo | 341/13 X |
| 4,733,069 | 3/1988 | Narutaki | 341/13 X |
| 4,736,187 | 4/1988 | Kibrick et al. | 250/231.14 X |
| 4,779,211 | 10/1988 | March | 364/560 X |
| 4,786,891 | 11/1988 | Ueda et al. | 33/707 X |
| 4,945,231 | 7/1990 | Ohya et al. | 250/231.14 |

*Primary Examiner*—Joseph L. Dixon
*Attorney, Agent, or Firm*—Oliff & Berridge

[57] ABSTRACT

An absolute position type of displacement detector employs multiple grating tracks. The pitches of the gratings in the respective tracks are set to be just slightly different so as to detect an absolute position from a small number of analog signals by a vernier. The number of tracks is set to be three or more so as to multiply the vernier, thereby enabling absolute position measurement in a wide measurement range.

8 Claims, 11 Drawing Sheets

DISPLACEMENT DETECTOR

BACKGROUND OF THE INVENTION

1. Field of the Invention

This invention relates to a displacement detector, and, more particularly, to an improvement of a displacement detector for detecting at an absolute position a relative displacement between first and second members by using periodic gratings.

2. Prior Art

There are two types of displacement detector used to measure a quantity such as the extent to which a tool of a machine tool is fed: an increment type of displacement detector which measures relative displacement between first and second members from the number of repetitions of a periodic primary signal formed by interaction between corresponding gratings relating to a track; and an absolute position type of displacement detector which detects at an absolute position a relative displacement between first and second members by using a plurality of primary signals formed by interaction between gratings endoded by, for example, largely changing pitches thereof with respect to each of tracks.

However, if, in the former, namely, the increment type of displacement detector, count errors occur, they are simply accumulated, directly resulting in an error in the measurement.

In the latter, namely, the absolute position type of displacement detector, occurrence of a count error does not result in an error in measurement since a displacement is measured at an absolute position. However, the gratings are fully encoded in such a manner that, as in a conventional method, the pitch of the grating in a second track is set to be twice as large as that of the grating in a first track; and the pitch of the grating in a third track is set to be twice as large as that of the grating in the second track . . . , occurrence of a detection error in one of the tracks or, in particular, one having a large pitch results in a large deviation of a measured value.

In addition, if an absolute position type of displacement detector is constituted by using optical gratings, it is necessary to set the same gaps in the gratings in each of the tracks in order to use a light source and an index scale in common. However, in the case where the encoded gratings are used, such equal gaps make it impossible to obtain good light reception signals because the difference between the pitches of the gratings in the different tracks is too large.

SUMMARY OF THE INVENTION

The present invention has been achieved with a view to overcoming the above-described problems of the conventional methods, and an object of the present invention is to provide a novel displacement detector capable of detecting a relative displacement at an absolute position from small number of analog signals, reducing dispersion of measured values even when detection errors occur, and obtaining good detection signals even if gaps in the gratings in the different tracks are equal to each other.

To this end, the present invention provides a displacement detector having: a first member provided with at least three periodic gratings of equal pitches which form at least three tracks while slightly changing the pitch every track; a second member in which periodic gratings having pitches corresponding to the gratings in the respective tracks of the first member are formed in respective tracks; a means for detection, with respect to each tracks, a primary signal formed by interaction between the gratings in the tracks corresponding to each other; and a means for obtaining secondary signals by calculating phase differences between the primary signals, the relative displacement between the first and second members being detected at an absolute position on the basis of at least phase differences between the secondary signals.

In accordance with the present invention, instead of using tracks of an absolute position type of displacement detector by encoding the same in the conventional manner, the pitches of the gratings in the respective tracks are set to be approximately equal values so as to detect an absolute position from a small number of analog signals by a vernier, and the number of tracks is set to be three or more so as to multiply the vernier, thereby enabling absolute position measurement of a wide measurement range.

The principle of detection in accordance with the present invention will be described below by way of example of a four track system.

It is assumed here that, as shown in FIG. 2, periodic gratings 22, 24, 26 and 28 of four equal pitches (P, P1, P2, and P3, respectively) whose phases coincide with each other at a reference point (x=0) are provided to form four tracks 12, 14, 16 and 18 on a scale surface of a main scale 10 provided at the first member while changing the pitch (by, for example, a constant value of ΔP) every track, and that, as shown in FIG. 3, periodic gratings 42, 44, 46 and 48 of pitches P, P1, P2 and P3 which correspond to the gratings 22 to 28 of the tracks 12 to 18 and whose phases coincide with each other at a reference point are formed in tracks 32, 34, 36 and 38, respectively, on a scale surface of an index scale 30 provided as the second member. Then a requirement which needs to be fulfilled when the first track 12 (32) and the second track 14 (44) constitute a vernier is, as is apparent from FIG. 4, represented by an equation:

$$L_1 = (N+1)P = N(P+\Delta P) \tag{1}$$

where L1 is a vernier length defined by the first track 12 (32) and the second track 14 (34), and N is an equally-dividing number (natural number).

Similarly, a requirement which needs to be fulfilled when the second track 14 (34) and the third track 16 (36) constitute a vernier is, as is apparent from FIG. 4, represented by an equation:

$$\begin{aligned} L_2 &= (N+2)(P+\Delta P) \\ &= (N+1)(P+2\Delta P) \\ &= L_1 + 2(P+\Delta P) \end{aligned} \tag{2}$$

where L2 is a vernier length defined by the second track 14 (34) and the third track 16 (36).

Similarly, a requirement which needs to be fulfilled when the third track 16 (36) and the fourth track 18 (38) constitute a vernier is, as is apparent from FIG. 4, represented by an equation:

$$L_3 = (N + 3)(P + 2\Delta P) \quad (3)$$
$$= (N + 2)(P + 3\Delta P)$$
$$= L_2 + 2(P + 2\Delta P)$$
$$= L_1 + 2(P + \Delta P) + 2(P + 2\Delta P)$$

where L3 is a vernier length defined by the third track 16 (36) and the fourth track 18 (38).

Then, from the equation (1), the following equation is formed:

$$\Delta P = P/N \quad (4)$$

If parameters P1, P2, P3 are defined by following equations:

$$P_1 = P + \Delta P = \{(N+1)/N\}P \quad (5)$$

$$P_2 = P + 2\Delta P = \{(N+2)/N\}P \quad (6)$$

$$P_3 = P + 3\Delta P = \{(N+3)/N\}P \quad (7)$$

In the result, equations (1), (2) and (3) are expressed as follows:

$$L_1 = (N + 1)P = NP_1 \quad (1')$$

$$L_2 = (N + 2)P_1 = (N + 1)P_2 \quad (2')$$
$$= L_1 + 2P_1$$

$$L_3 = (N + 3)P_2 = (N + 2)P_3 \quad (3')$$
$$= L_2 + 2P_2 = L_1 + 2P_1 + 2P_2$$

Therefore, phases $\phi_0$, $\phi_1$, $\phi_2$ and $\phi_3$ of primary signals obtained by the gratings in the four tracks relative to the reference point are presented by the following equations if a displacement from the reference point (origin) is X (see FIG. 4):

$$\phi_0 = 2\pi(x/P) \quad (8)$$

$$\phi_1 = 2\pi(x/P_1) \quad (9)$$

$$\phi_2 = 2\pi(x/P_2) \quad (10)$$

$$\phi_3 = 2\pi(x/P_3) \quad (11)$$

Next, secondary signals $\Phi_0$, $\Phi_1$, $\Phi_2$ and $\Phi_3$ which are phase difference between the primary signals $\phi_0$, $\phi_1$, $\phi_2$ and $\phi_3$ are obtained by using $\phi_0$, $\phi_1$, $\phi_2$ and $\phi_3$ as represented by the following equation (see FIG. 5):

$$\Phi_1 = \phi_0 - \phi_1 = 2\pi x(1/P - 1/P_1) \quad (12)$$
$$= 2\pi x\{1/(N + 1)\} \cdot (1/P)$$
$$= 2\pi x(1/NP_1) = 2\pi(x/L_1)$$

$$\Phi_2 = \phi_1 - \phi_2 = 2\pi x(1/P_1 - 1/P_2) \quad (13)$$
$$= 2\pi x \cdot [N/\{(N + 1)(N + 2)\}] \times (1/P)$$
$$= 2\pi x\{1/(N + 1)\} \cdot (1/P_2)$$
$$= 2\pi(x/L_2)$$

-continued
$$\Phi_3 = \phi_2 - \phi_3 = 2\pi x(1/P_2 - 1/P_3) \quad (14)$$
$$= 2\pi x [N/\{(N + 1)(N + 3)\}] \cdot (1/P)$$
$$= 2\pi x\{1/(N + 2)\} \cdot (1/P_3)$$
$$= 2\pi(x/L_3)$$

Tertiary signals $\psi_1$ and $\psi_2$ which are phase differences between the secondary signals $\Phi_1$, $\Phi_2$ and $\Phi_3$ are obtained by using $\Phi_1$, $\Phi_2$ and $\Phi_3$ as represented by the following equations (see FIG. 6):

$$\psi_1 = \Phi_1 - \Phi_2 = 2\pi x(1/L_1 - 1/L_2) \quad (15)$$
$$= 2\pi x\{2P_1/(L_1 L_2)\}$$
$$= 2\pi x[\{2(N + 1)P\}/(NL_1 L_2)]$$

$$\psi_2 = \Phi_2 - \Phi_3 = 2\pi x(1/L_2 - 1/L_3) \quad (16)$$
$$= 2\pi x\{2P_2/(L_2 L_3)\}$$
$$= 2\pi x[\{2(N + 2)P\}/(NL_2 L_3)]$$

A quartic signal $\Psi$ which is the phase difference between the tertiary signals $\psi_1$ and $\psi_2$ is obtained by using $\psi_1$ and $\psi_2$ as represented by the following equation (see FIG. 6):

$$\Psi = \psi_1 - \psi_2 \quad (17)$$
$$= 2\pi x\{2P_1/(L_1 L_2) - 2P_2/(L_2 L_3)\}$$
$$= 2\pi x \cdot 2\{P_1/(L_1 L_2) - P_2/(L_2 L_3)\}$$
$$= 2\pi x[\{2(P_1 L_3 - P_2 L_1)\}/(L_1 L_2 L_3)]$$

If equations:

$$L_{11} = (N + 2)/2 \cdot L_1 = (N/2)L_2 \quad (18)$$

$$L_{12} = (N + 3)/2 \cdot L_2 \quad (19)$$
$$= (N + 1)/2 \cdot L_3$$

are formed, a condition when the quartic signal $\Psi$ becomes $2\pi$, namely, a maximum range Lmax of absolute position detection is represented by the following equation:

$$x(L\max) \quad (20)$$
$$= L_1 L_2 L_3/\{2(P_1 L_3 - P_2 L_1)\}$$
$$= \{N(N + 1) L_3\}/6$$
$$= (N/3) \cdot L_{12} = (N + 3)/3 \cdot L_{11}$$
$$= (N + 2)(N + 3)/6 \cdot L_1$$
$$= (N + 1)(N + 2)(N + 3)/6 \cdot P$$

Therefore, an absolute position xQ of a point to be obtained, e.g., a point Q is obtained from the value of the quartic signal $\Psi$ within a range of the quartic signal $\Psi$ of 0 to $2\pi$, that is, a range of the displacement x of 0 to Lmax = $(N+3)/3 \times L_{11}$, as shown in FIG. 1, by the following equation:

$$\begin{aligned}
\cdot Q &= L_{11} + (N-2)/2 \times L_1 + \\
&\quad (N-2) \cdot P + (\phi_0/2\pi) \cdot P \\
&= \{(N+1)(N+2)\}/2 \cdot P + \\
&\quad \{(N-2)(N+1)\}/2 \cdot P + \\
&\quad (N-2) \cdot P + (\phi_0/2\pi) \cdot P
\end{aligned} \quad (21)$$

If the pitch P of the grating in the reference (first) track 12 (32) is, for example, 60 μm and if the equally-dividing number N is 60, then P1=61 μm, P2=62 μm, P3=63 μm are obtained from equations (5), (6) and (7). So, the vernier length L1=3660 μm is obtained from equation (1), and L11=113460 μm from equation (18). The maximum measurement length Lmax in this case is calculated by equation (20) and Lmax=2382.66 mm is obtained, thus realizing an absolute position type of linear displacement detector of a measurement length of equal to or greater than 2 m. In this case, the position of the arbitrary point xQ is determined from equation (21) when $\phi_0$ is $\pi$, as follows:

$$\begin{aligned}
xQ &= L_{11} + \{(N-2)/2\}L_1 + \\
&\quad (N-2)P + (\phi_0/2\pi)P \\
&= 223080 + (\phi_0/2\pi) \cdot 60 \\
&= 223.110 \ \mu m
\end{aligned}$$

If the pitch P of the grating in the reference (first) track 12 (32) is 42 μm and if the equally-dividing number N is 42, then P1=43 μm, P2=44 μm, P3=45 μm. So, the vernier Length L1=1806 μm is obtained from equation (1), and L11=39732 μm from equation (18). The maximum measurement length Lmax=595.98 mm is calculated by equation (20), thus realizing an absolute position type of linear displacement detector of a measurement length of approximately 600 mm. In this case, the accuracy of measurement is improved compared with the former case because the pitch is reduced. The position of the arbitrary point xQ is determined from equation (21) when $\phi_0$ is $\pi$, as follows:

$$\begin{aligned}
\cdot Q &= 77.532 + (\phi_0/2\pi) \times 42 \\
&= 77.553 \ \mu m
\end{aligned}$$

Equations (1) (2) and (3) are based on one of applied principles in which the pitch change value ΔP is constant. However, if different pitch change values ΔP, αΔP and βΔP are set as in more generalized case, it is sufficient to satisfy the following equations, which may require complicated calculations;

$$L_1 = (N+1)P = N(P + \Delta P) \quad (22)$$

$$\begin{aligned}
L_2 &= (N+2)(P + \Delta P) \\
&= (N+1)(P + \alpha\Delta P)
\end{aligned} \quad (23)$$

$$\begin{aligned}
L_3 &= (N+3)(P + \alpha\Delta P) \\
&= (N+2)(P + \beta\Delta P)
\end{aligned} \quad (24)$$

Also, the number of tracks is not limited to 4, and it may be 3, 5 or more. If, for example, the track number is set to 3, the absolute position may be detected from the tertiary signal ψ1 which is the phase difference between the secondary signals Φ1 and Φ2.

In accordance with the present invention, as described above, an absolute position can be detected on the basis of analog signals, so that even if a detection error occurs, it does not result in a considerable measurement error as in the case of the coding type of detector. The present invention makes it possible to equalize gaps in the gratings in multiple tracks so that the structure can be simplified specifically in the case of an optical displacement detector by using a light source and an index scale in common.

The present invention is suitable for optical displacement detectors since it enables gaps in the gratings in respective tracks to be equalized. However, the detection method is not limited to the optical type, and the present invention is applicable to other linear encoders or rotary encoders of, e.g., a magnetic type, electromagnetic induction type, or capacitance type and so on.

BRIEF DESCRIPTION OF THE DRAWINGS

The exact nature of this invention, as well as other object and advantages thereof, will be readily apparent from consideration of the following specification relating to the accompanying drawings, in which like reference characters designate the same or similar parts throughout the figures thereof and wherein:

FIG. 11 is a flow chart showing a procedure of calculating an absolute position by means of a central processing unit.

DESCRIPTION OF THE BEST MODES

A transmission-type optical linear displacement detector which represents an embodiment of the present invention will be described below in detail with reference to the accompanying drawings.

Figure 7:
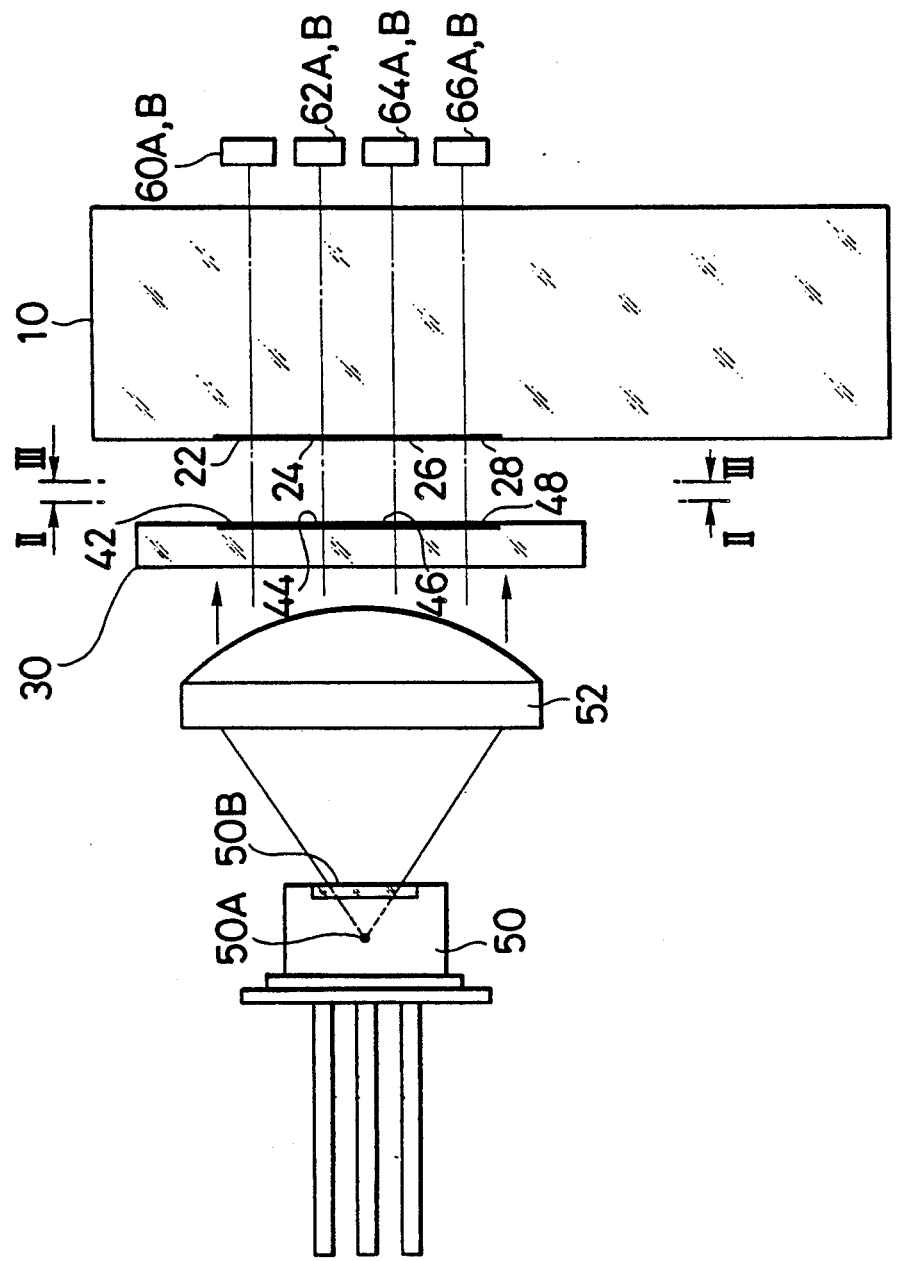
FIG. 7 is a cross-sectional view showing the entire construction of a displacement detector which represents an embodiment of the present invention.

This embodiment is provided with, as shown in FIG. 7, a light source constituted by a light emitting diode (LED) 50, for example, and a collimator lens 52 which converts illumination light radially emitted from a light source portion 50A of the LED 50 through a glass window 50B into parallel rays.

Figure 3:
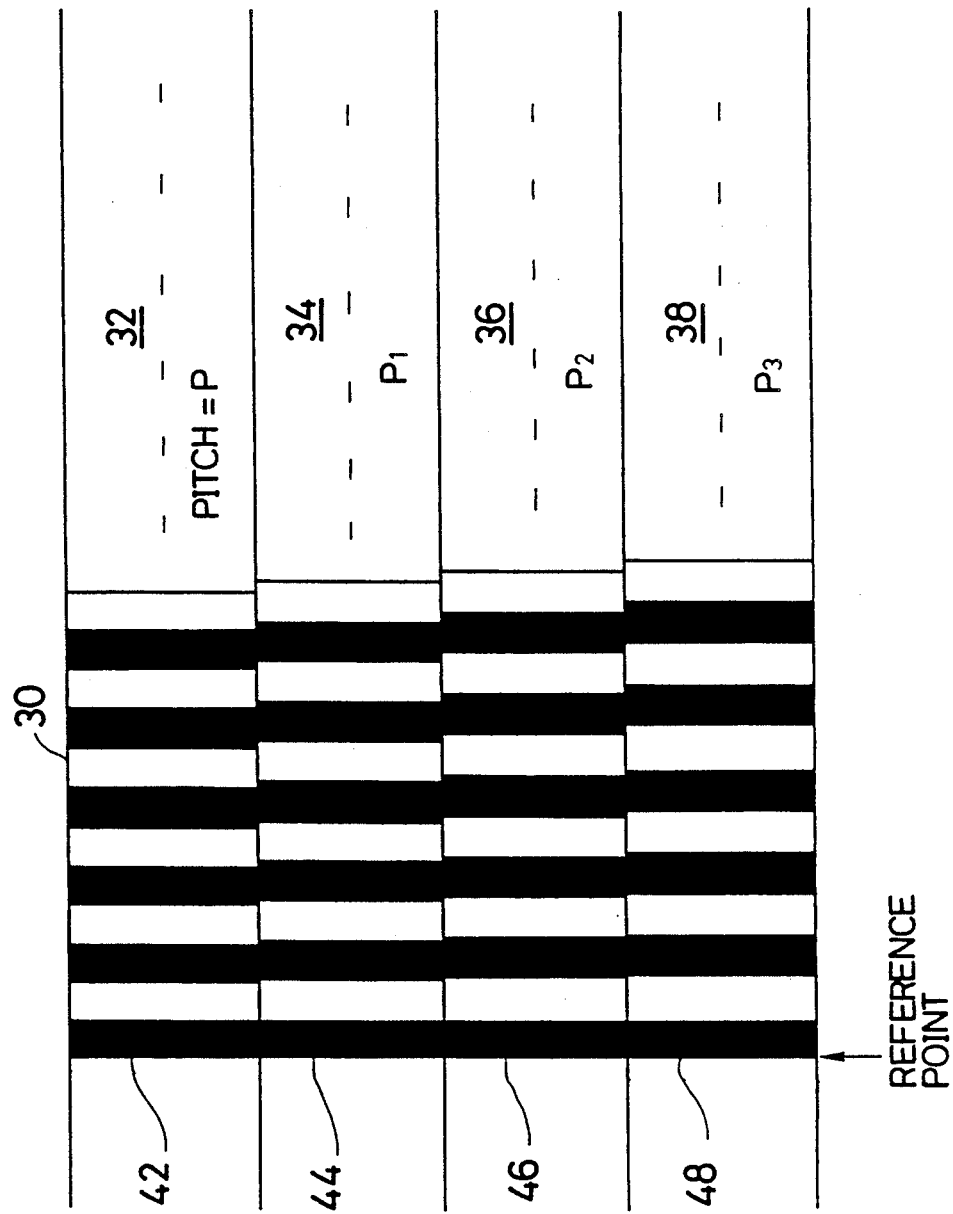
FIG. 3 is a plan view showing the scale surface of an index scale of this embodiment.
Figure 4:
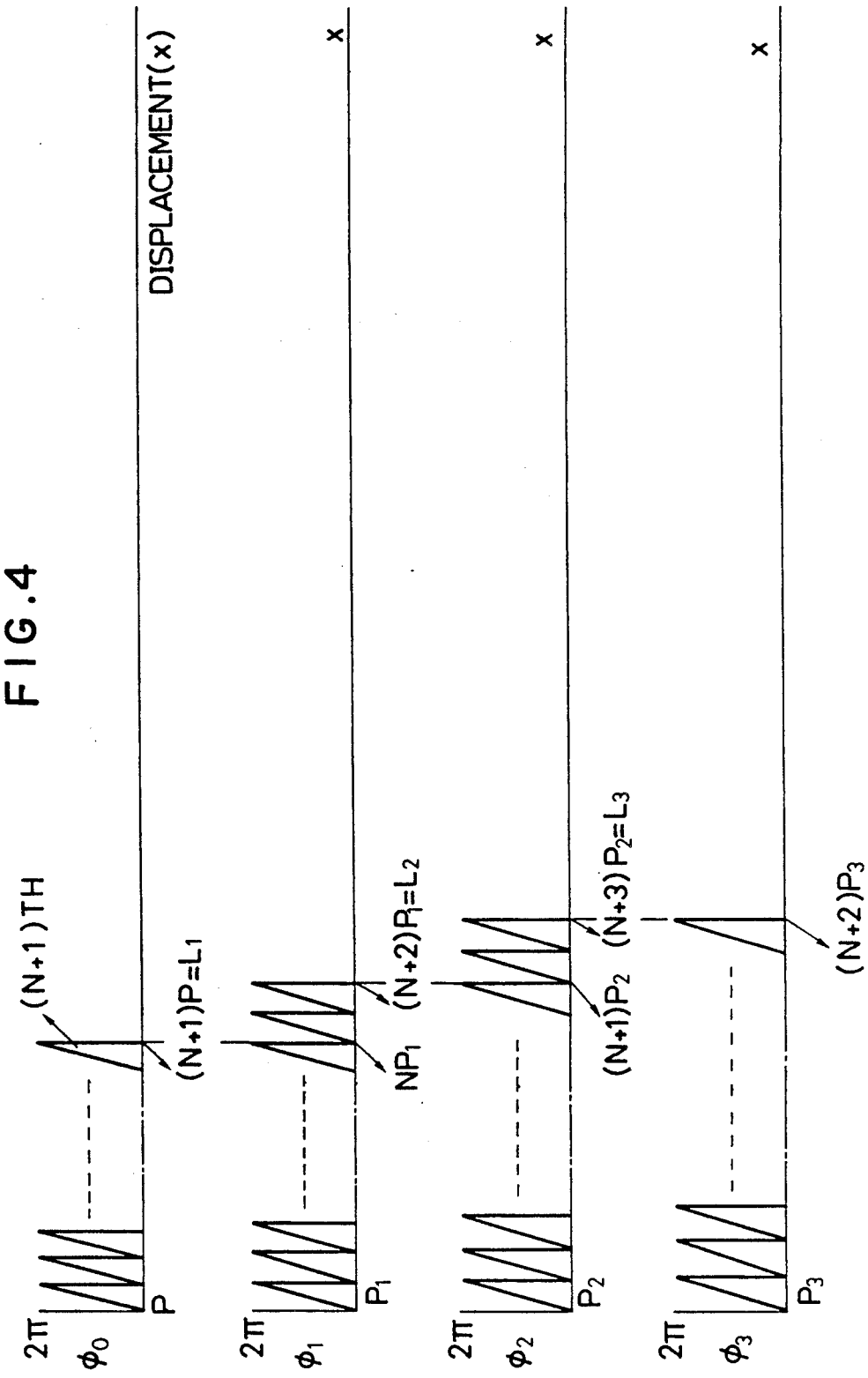
FIG. 4 is a diagram showing examples of primary signals of this embodiment.
Figure 5:
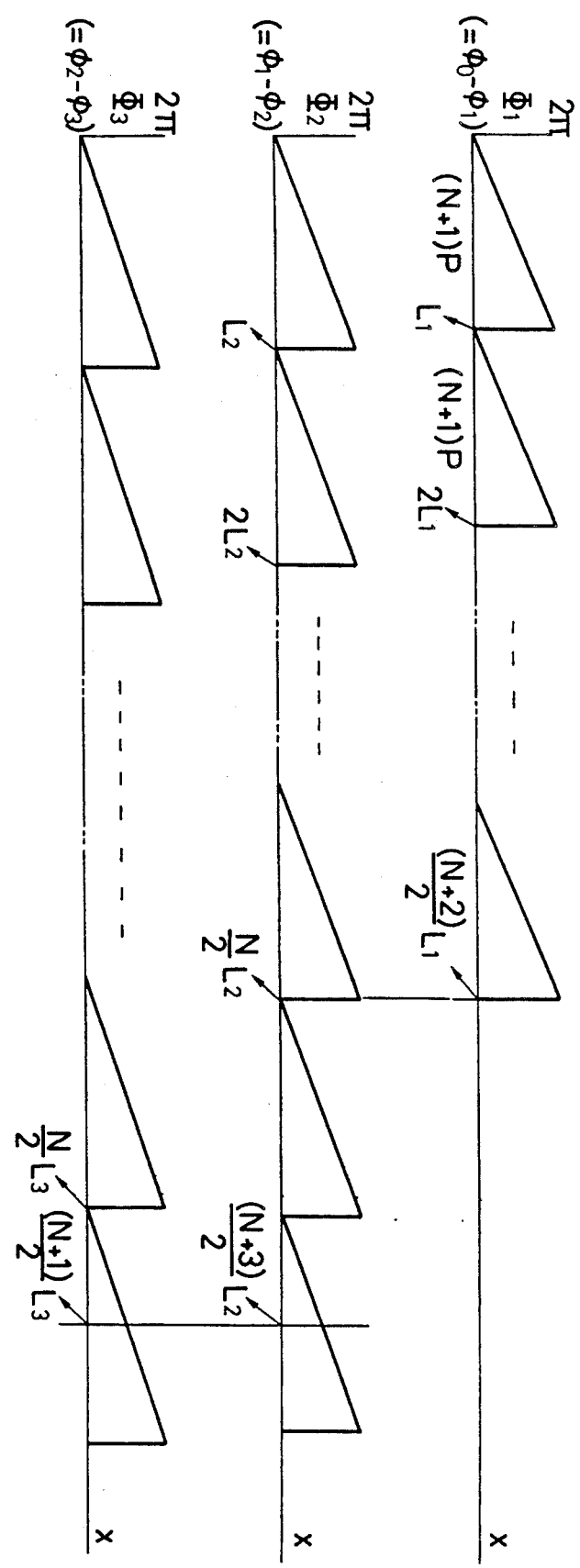
FIG. 5 is a diagram showing examples of secondary signals of this embodiment.
Figure 6:
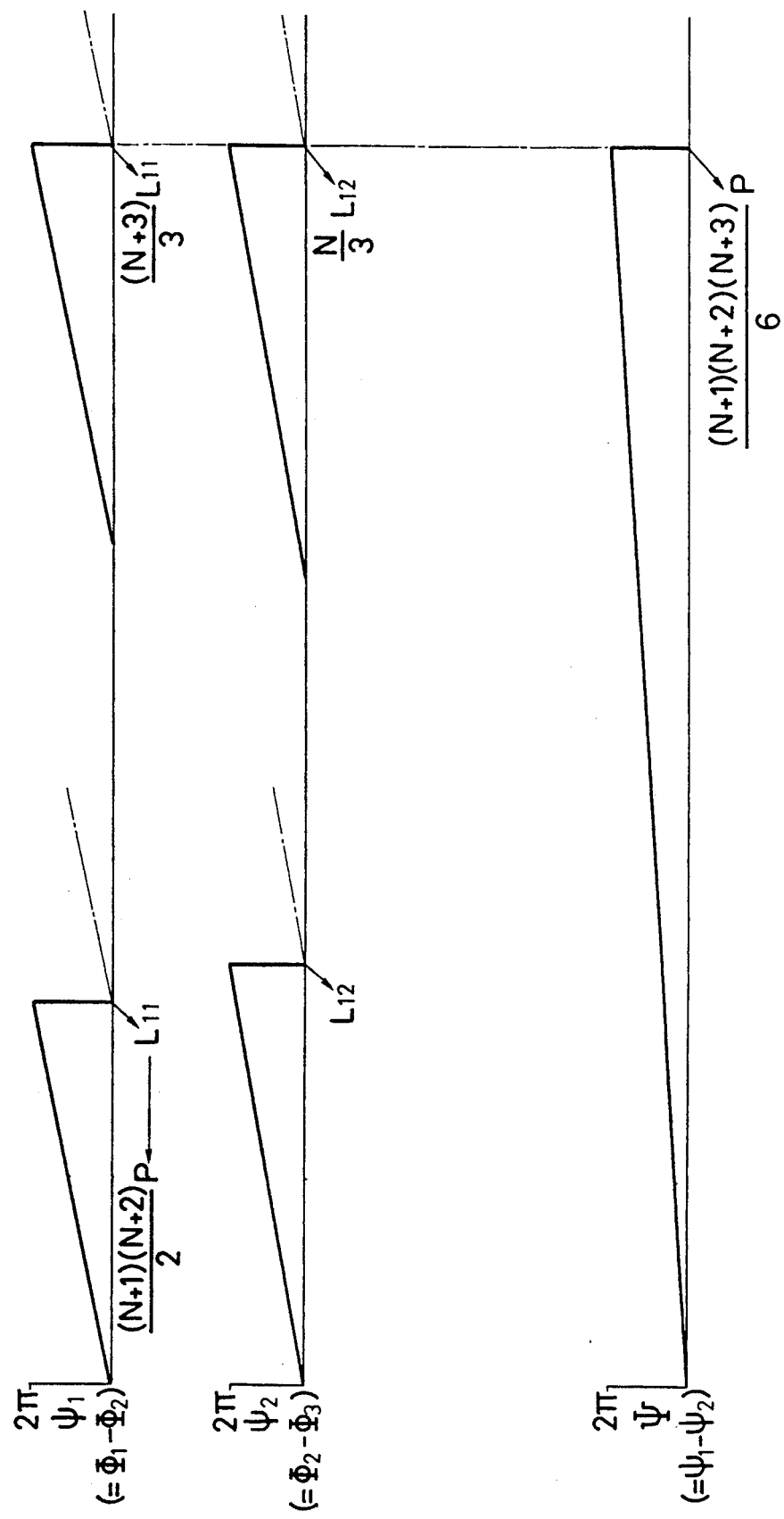
FIG. 6 is a diagram showing examples of tertiary and quartic signals of this embodiment.
Figure 8:
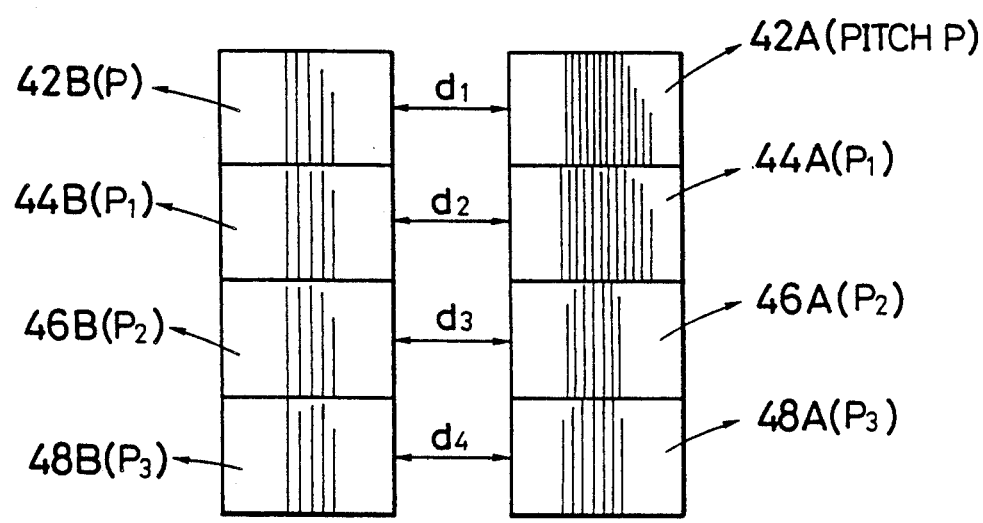
FIG. 8 is a plan view showing an example of the arrangement of gratings of the index scale used in the above embodiment.

Parallel rays formed by the collimator lens 52 are radiated to the index scale 30 having a graduation such as that shown in FIG. 3. As shown in FIG. 8 in which details of the arrangement of windows of the index scale 30 are shown, the index scale 30 has pairs of gratings 42A, 42B, 44A, 44B, 46A, 46B, 48A and 48B spaced apart from each other by distances d1, d2, d3 and d4 in the moving direction of the index scale 30. The distances d1 to d4 are set as represented by, for example, the following equations in order to provide a phase difference of 90° between each pair of gratings A and B:

$$d_1 = M_1 P + (\tfrac{1}{4}) P \quad (25)$$

$$d_2 = M_2 P_1 + (\tfrac{1}{4}) P_1 \quad (26)$$

$$d_3 = M_3 P_2 + (\tfrac{1}{4}) P_2 \quad (27)$$

$$d_4 = M_4 P_3 + (\tfrac{1}{4}) P_3 \quad (28)$$

where m1, m2, m3 and m4 are integers.

In this embodiment, the pairs of gratings of the index scale 30 with phase differences of 90° given therebetween are provided in order that, when the main scale 10 and the index scale 30 are relatively moved, eight signals are obtained from four tracks with a phase difference of 90° to perform interpolation division within the range of 0° to 90° or to perform directional discrimination within the range of interpolation.

Figure 1:
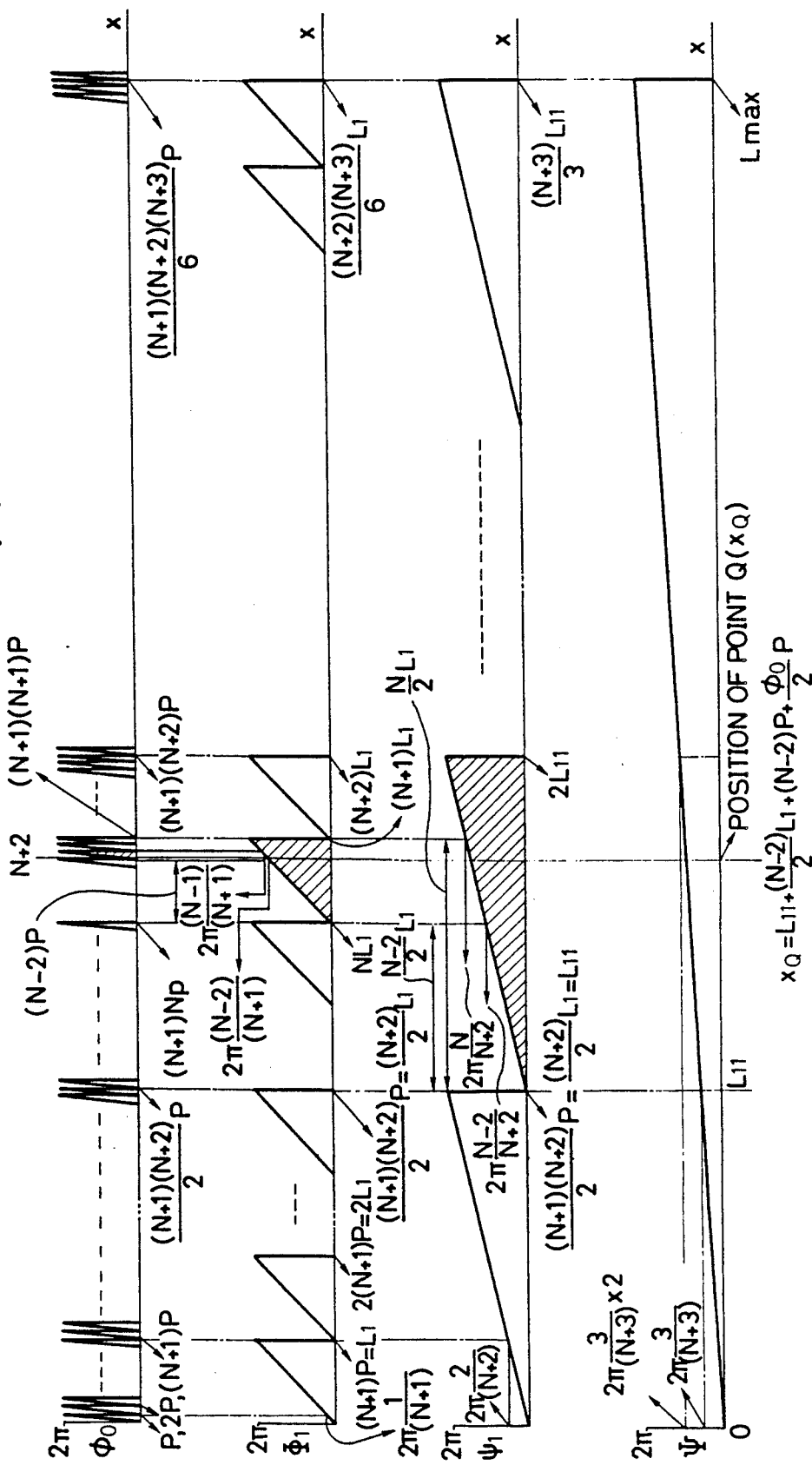
FIG. 1 is a diagram showing the principle of measurement performed by a displacement detector according to the present invention.
Figure 2:
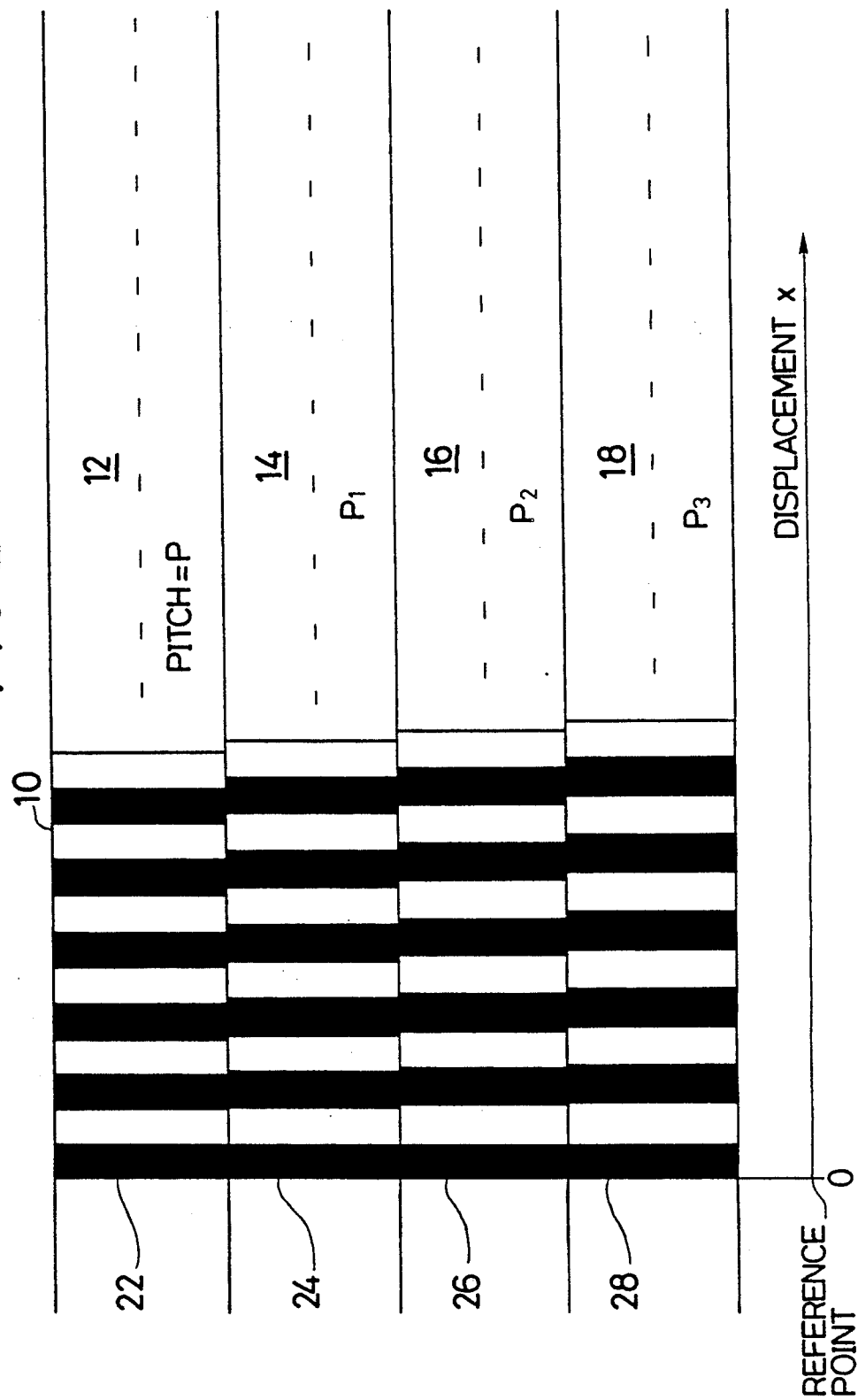
FIG. 2 is a plan view showing the scale surface of a main scale provided in an embodiment of the present inventon.

The illumination light which has been transmitted through the index scale 30 are introduced to the main scale 10 having a graduation such as that shown in FIG. 2. As described above, four tracks 12, 14, 16 and 18 are formed on the main scale 30.

The illumination light which has been transmitted through the main scale 10 is introduced to, for example, four pairs (namely eight in total) of light receiving elements 60A, 60B, 62A, 62B, 64A, 64B, 66A and 66B respectively adapted to the tracks in correspondence with the gratings 42A, 42B, 44A, 44B, 46A, 46B, 48A and 48B of the index scale 30. Therefore a pair of sine waves with two phases differing from each other by 90° is obtained from each track as the index scale 30 and the main scale 10 relatively move.

Figure 9:
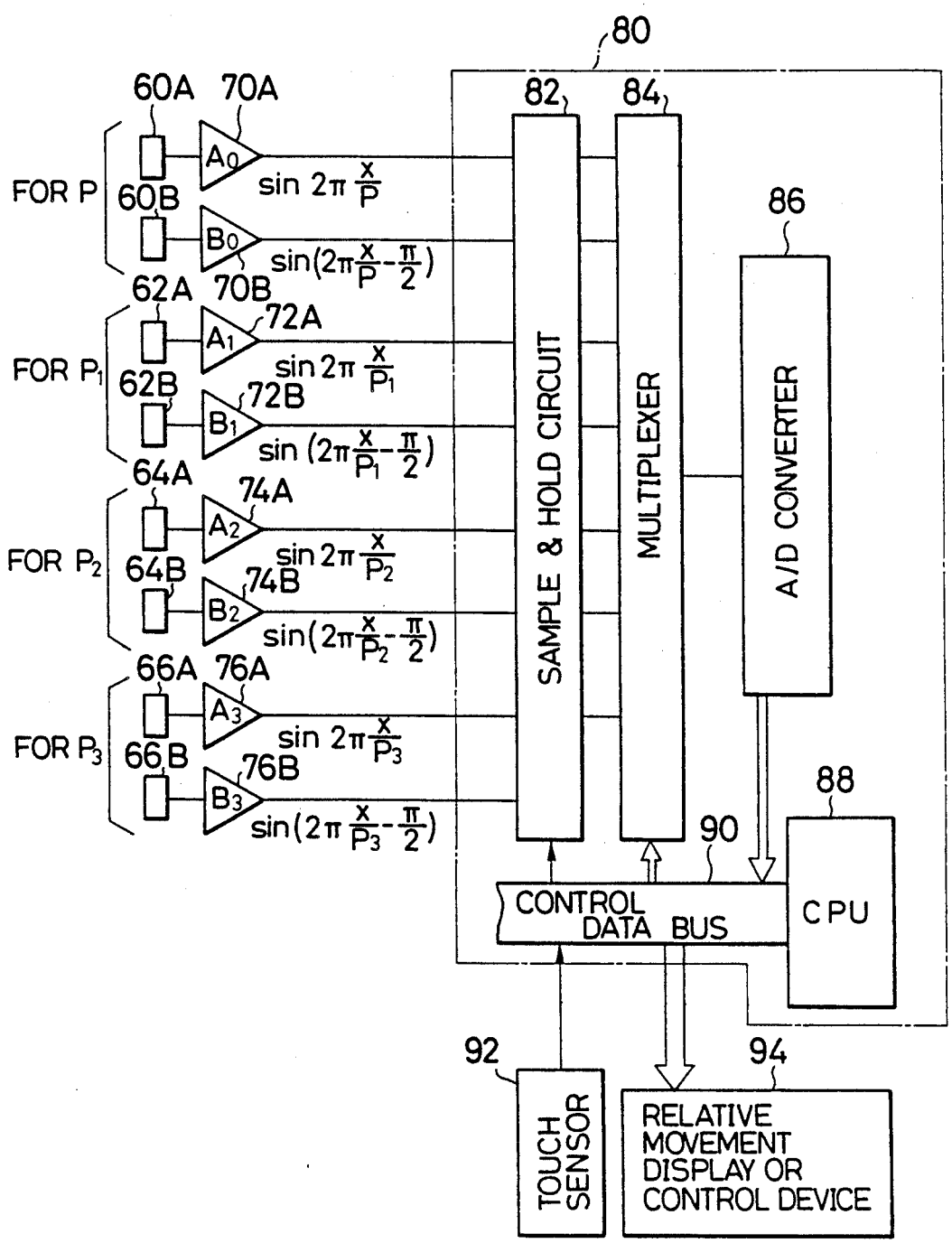
FIG. 9 is a block diagram showing the construction of an absolute displacement detection circuit used in the embodiment.

Outputs from the light receiving elements 60A, 60B, 62A, 62B, 64A, 64B, 66A and 66B are, as shown in FIG. 9, input into an absolute displacement detection circuit 80 via preamplifiers 70A, 70B, 72A, 72B, 74A, 74B, 76A and 76B.

The absolute displacement detection circuit 80 is constituted by a sample and hold circuit 82, a multiplexer 84, an A/D (analog/digital) converter 86, a CPU (central processing unit) 88, and a control data bus 90. Constants including the above-mentioned pitch P and the equally-dividing number N are set in the CPU 88.

A touch sensor 92 for detecting the measuring timing and issuing a signal from the outside of the absolute displacement detection circuit 80 and a relative movement display 94 for directly displaying a result of calculation performed by the CPU 88, namely, a measured value based on an absolute position or a control device (94) for controlling the extent of feed of a tool on the basis of this measured value are provided.

Figure 10:
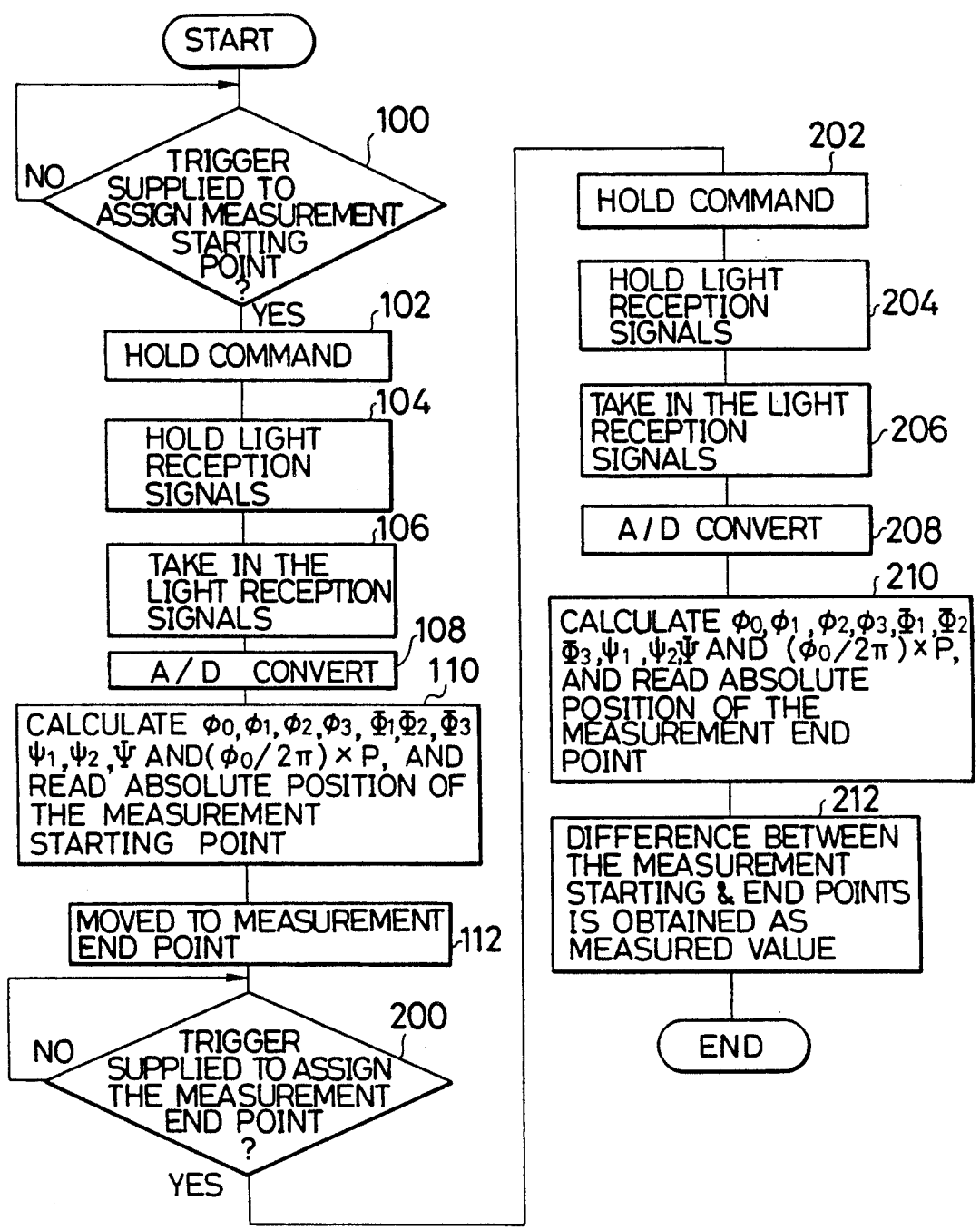
FIG. 10 is a flow chart showing the operation of the embodiment.

The operation of this embodiment will be described below with reference to FIG. 10 with respect to a case in which the main scale 10 and index scale 30 are attached to a machine tool or the like and are relatively moved.

When, in step 100, a trigger is supplied from the touch sensor 92 to assign a measurement starting point, the CPU 88 issues a hold command to the sample and hold circuit 82 via the control data bus 90 in step 102. In step 104, the sample and hold circuit 82 holds light reception signals, namely, analog electrical singals supplied from output terminals of the preamplifiers 70A, 70B, 72A, 72B, 74A, 74B, 76A and 76B. In step 106, the multiplexer 84 takes in the light reception signals under the command of the CPU 88. In step 108, these signals are converted into digital signals by the A/D converter 86 and are thereafter input into the CPU 88. In step 110, the CPU 88 calculates, by using the above-mentioned equations (8) to (17), the primary signals (phases) $\phi 0$, $\phi 1$, $\phi 2$ and $\phi 3$, the secondary signals $\Phi 1$, $\Phi 2$ and $\Phi 3$, the tertiary signals $\psi 1$ and $\psi 2$, and the quartic signal $\Psi$, and calculates the phase $(\phi 0/2\pi) \times P$ in the first grating 22, thereby reading the absolute position of the measurement starting point.

In step 112, the main scale 10 and/or the index scale 30 are moved to a measurement end point, namely, a target value.

Thereafter, in steps 200 to 210, a process similar to that defined by steps 100 to 110 is conducted, thereby reading the absolute position of the measurement end point.

Finally, in step 212, for example, the difference between the measurement starting and end points, namely, the extent of relative movement is obtained as a measured value.

Processing in step 110 or 210 is performed by a procedure such as that shown in FIG. 11.

That is, if, in step 300, digitally converted analog light reception signals as follows:

$$\sin(2\pi x/P)(= \sin\phi_0),$$
$$\sin(2\pi x/P - \pi/2)\{= \sin(\phi_0 - 90°)\},$$
$$\sin(2\pi x/P_1)(= \sin\phi_1),$$
$$\sin(2\pi x/P_1 - \pi/2)\{= \sin(\phi_1 - 90°)\},$$
$$\sin(2\pi x/P_2)(= \sin\phi_2),$$
$$\sin(2\pi x/P_2 - \pi/2)\{= \sin(\phi_2 - 90°)\},$$
$$\sin(2\pi x/P_3)(= \sin\phi_3)$$
$$\sin(2\pi x/P_3 - \pi/2)\{= \sin(\phi_3 - 90°)\}$$

are supplied from the A/D conveter 86, the CPU 88 extracts the phase components $\phi 0$, $\phi 1$, $\phi 2$ and $\phi 3$ in step 302.

In steps 304 to 308, the above-mentioned equations (12) to (17) are calculated to successively obtain following values:

$$\Phi_1(=\phi_0-\phi_1), \Phi_2(=\phi_1-\phi_2)$$

$$\Phi_3(=\phi_2-\phi_3), \psi_1(=\Phi_1-\Phi_2)$$

$$\psi_2(=\Phi_2-\Phi_3), \Psi(=\psi_1-\psi_2)$$

of the six functions in correspondence with the phase differences.

In step 310 and steps which follow step 310, calculations are performed by using the above-mentioned equation (21). That is, in step 310, the value of a in the following equation, namely, the number of a cycle in the cycles of the lower order tertiary signal $\psi 1$ of the period L11 at which the value of the highest order quartic signal $\Psi$ is located is first obtained.

$$2\pi\{3/(N+3)\}a \leq \Psi < 2\pi\{3/(N+3)\}(a+1) \quad (29)$$

The following calculation is performed by using a value of a thus obtained, and a value corresponding to the first term on the right side of the above-mentioned equation (21) is calculated.

$$aL_{11} = a\{(N+1)(N+2)/2\}P \quad (30)$$

The values of the constant P and N are previously set in the CPU 88.

The process then proceeds to step 312, the value of b in the following equation, namely, the number of a cycle in the cycles of the lower order secondary signal $\Phi 1$ of the period (vernier length) L1 at which the value of the higher order tertiary signal $\psi 1$ is located is obtained.

$$2\pi\{2/(N+2)\}b \leq \psi_1 < 2\pi\{2/(N+2)\}(b+1) \quad (31)$$

The following calculation is performed by using a value of b thus obtained, and a value corresponding to the second term on the right side of the above-mentioned equation (21) is calculated.

$$bL_1 = b(N+1)P \quad (32)$$

The process then proceeds to step 314, the value of c in the following equation, namely, the number of a cycle in the cycles of the lowest order primary signal $\phi 0$ of the period (pitch) P at which the value of the higher order secondary signal $\Phi 1$ is located is obtained.

$$2\pi\{1/(N+1)\}c \leq \Phi_1 < 2\pi\{1/(N+1)\}(c+1) \quad (33)$$

By using a value of c thus obtained, a value corresponding to the third term on the right side of the above-mentioned equation (21), namely, cP is calculated.

The process then proceeds to step 316, and a value corresponding to the fourth term on the right side of the above-mentioned equation (21), namely, $\phi 0/2\pi P$ is calculated from the value of the primary signal $\phi 0$.

The process then proceeds to step 318, and the absolute position X is calculated by the following equation:

$$X = aL_{11} + bL_1 + cP + (\phi_0/2\pi)P \quad (34)$$

The reason for the use of dual phase sine wave signals with a phase difference of 90° with respect to each track in this embodiment is that, in particular, interpolation division within a range of the minimum pitch reference signal $\phi 0$ of 0° to 90° and/or directional discrimination within the range of this interpolation are performed in order to further improve the resolution. Since the interpolation division and/or directional discrimination are particularly necessary at a position of the minimum pitch, it is possible to use single phase signals with respect to the second to fourth tracks. If also there is no need for interpolation division and/or directional discrimination with respect to the first track, it is possible to provide only single phase signals with respect to all of the tracks.

A function of calculating the present position by the absolute position from the origin and displaying the position thereby calculated without storing the absolute position of the measurement starting point and/or a function of inverting plus and minus directions can be set as desired by the CPU 88 in response to an external signal fed from the outside.

In this embodiment, light reception signals relating to the measurement starting point and the measurement end point are sampled and held by using signals output from the touch sensor 92, thereby enabling the measurement to be performed speedily and easily. However, it is also possible to remove the touch sensor 92.

In the above-described embodiment, the present invention is applied to a transmission type of optical linear displacement detector. However, applications of the present invention are not limited to this type, and the present invention can also be applied to a reflection type of displacement detector or rotary encoder. Also, the detection method is not limited to the optical type, and it is apparent that the present invention can be applied to a magnetic encoder using a magnetic scale, an electromagnetic induction encoder, a capacitance type of encoder, etc.

What is claimed is:

1. An absolute position displacement detector comprising:
    a first member provided with at least three periodic gratings including a minimum pitch grating as a reference grating, each of said gratings having a constant pitch, the constant pitch differing slightly relative to the pitch of said minimum pitch grating from one to the next of said at least three gratings;
    a second member provided with a set of periodic gratings corresponding in number and pitch to said gratings of the first member;
    means for detecting, with respect to each grating of said first member, primary signals formed by interaction between corresponding said gratings of the first and second members;
    means for obtaining secondary signals by calculating phase differences between adjacent primary signals; and
    means for obtaining a third signal by calculating phase differences between adjacent secondary signals,
    whereby a position number of the secondary signal is determined from a value of the third signal, a position number of the primary signal is determined from a value of the secondary signal, and relative displacement between the first and second members is determined on the basis of the position number and value of the primary signal.

2. A displacement detector as set forth in claim 1, wherein the constant pitches of said at least three periodic gratings differ from each other by a constant value.

3. A displacement detector as set forth in claim 2, wherein the number of said gratings on the first member is four, and the constant pitches P1 to P3 of the second to fourth gratings are respectively set as follows:

$$P1 = \{(N+1)/N\}P$$

$$P2 = \{(N+2)/N\}P$$

$$P3 = \{(N+3)/N\}P$$

wherein P is the constant pitch of the minimum pitch grating as the reference grating and N is an equally-dividing (natural) number.

4. A displacement detector as set forth in claim 1, wherein at least a minimum pitch grating of said set of periodic gratings of the second member comprises a pair of superimposed gratings with a phase difference of 90° therebetween.

5. A displacement detector as set forth in claim 1, wherein phases of said gratings coincide with each other at a reference point.

6. A displacement detector as set forth in claim 1, wherein primary signals are sampled and held by using signals output from a touch sensor at a measurement starting point and a measurement end point.

7. A displacement detector as set forth in claim 1, wherein said gratings are optical gratings.

8. An absolute position displacement detector comprising:

a body having at least three periodic gratings fixed thereon including a minimum pitch grating as a reference grating, each of said gratings having a constant pitch, the constant pitch differing slightly relative to the pitch of said minimum pitch grating from one to a next of said at least three gratings;

a detector means for detecting a primary signal from each of the at least three gratings;

means for obtaining secondary signals by calculating phase differences between adjacent primary signals; and means for obtaining a third signal by calculating phase differences between adjacent secondary signals, whereby a position number of the secondary signal is determined from a value of the third signal, a position number of the primary signal is determined from a value of the secondary signal, and relative displacement of the body is determined on the basis of the position number and value of the primary signal.

* * * * *